(12) United States Patent
Chen et al.

(10) Patent No.: US 8,889,497 B2
(45) Date of Patent: Nov. 18, 2014

(54) SEMICONDUCTOR DEVICES AND METHODS OF MANUFACTURE THEREOF

(71) Applicant: Taiwan Semiconductor Manufacturing Company, Ltd., Hsin-Chu (TW)

(72) Inventors: Chi-Yuan Chen, Hsin-Chu (TW); Teng-Chun Tsai, Tainan (TW); Kuo-Yin Lin, Jhubei (TW); Wan-Chun Pan, Hsin-Chu (TW); Hsiang-Pi Chang, New Taipei (TW); Shi Ning Ju, Hsin-Chu (TW); Yen-Yu Chen, Taipei (TW); Hongfa Luan, Hsin-Chu (TW); Kuo-Cheng Ching, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/730,640

(22) Filed: Dec. 28, 2012

(65) Prior Publication Data

US 2014/0183633 A1    Jul. 3, 2014

(51) Int. Cl.
*H01L 21/84* (2006.01)
*H01L 29/78* (2006.01)
*H01L 29/66* (2006.01)

(52) U.S. Cl.
CPC ...... *H01L 29/7855* (2013.01); *H01L 29/66484* (2013.01)
USPC .......................................... 438/151; 257/347

(58) Field of Classification Search
USPC ......... 438/151, 149, 142, 478, 270, 283, 400, 438/479, 157, 197, 268, 424, 586, 299, 589, 438/703, 107, 137, 138, 156, 158, 164, 172, 438/188; 257/E21.409, E29.255, 288, 347, 257/E21.09, E21.41, 330, E21.19, E27.06, 257/E27.112, E29.245, E29.262, E29.273, 257/368, 76, E21.421, E21.54, E21.546, 257/24, 329, 9, E21.403, E21.404, E21.411
See application file for complete search history.

(56) References Cited

U.S. PATENT DOCUMENTS

| 8,012,839 | B2 * | 9/2011 | Liu et al. ........................ 438/300 |
| 8,361,869 | B2 * | 1/2013 | Zhou et al. ..................... 438/289 |
| 2013/0334610 | A1 * | 12/2013 | Moroz et al. .................. 257/369 |
| 2014/0042500 | A1 * | 2/2014 | Wann et al. .................... 257/288 |

OTHER PUBLICATIONS

LeGoues, F.K., et al., "Kinetics and mechanism of oxidation of SiGe: dry versus wet oxidation," Appl. Phys. Lett. vol. 54, No. 7, Feb. 13, 1989; 4 pages.

(Continued)

*Primary Examiner* — Julio J Maldonado
*Assistant Examiner* — Robert Bachner
(74) *Attorney, Agent, or Firm* — Slater & Matsil, L.L.P.

(57) ABSTRACT

Semiconductor devices and methods of manufacture thereof are disclosed. In some embodiments, a method of manufacturing a semiconductor device includes partially manufacturing a fin field effect transistor (FinFET) including a semiconductor fin comprising a first semiconductive material and a second semiconductive material disposed over the first semiconductive material. A top portion of the second semiconductive material of the semiconductor fin is removed, and a top portion of the first semiconductive material is exposed. A top portion first semiconductive material is removed from beneath the second semiconductive material. The first semiconductive material and the second semiconductive material are oxidized, forming a first oxide comprising a first thickness on the first semiconductive material and a second oxide comprising a second thickness on the second semiconductive material, the first thickness being greater than the second thickness. The second oxide is removed from the second semiconductive material, and manufacturing of the FinFET is completed.

20 Claims, 7 Drawing Sheets

(56) References Cited

OTHER PUBLICATIONS

Pouydebasque, A., et al., "High-Performance High-K/Metal Planar Self-Aligned Gate-All-Around CMOS Devices," IEEE Transactions on Nanotechnology, vol. 7, No. 5, Sep. 2008, pp. 551-557.

Tanaka, M., et al., "Abnormal oxidation characteristics of SiGe/S-on-insulator structures depending on piled-up Ge fraction at SiO2/SiGe interface," J. Appl. Phys. 103, 054909 (2008); 6 pages.

Tételin, C., et al., "Kinetics and mechanism of low temperature atomic oxygen-assisted oxidation of SiGe layers," J. Appl. Phys. vol. 83, No. 5, Mar. 1, 1998; 6 pages.

\* cited by examiner

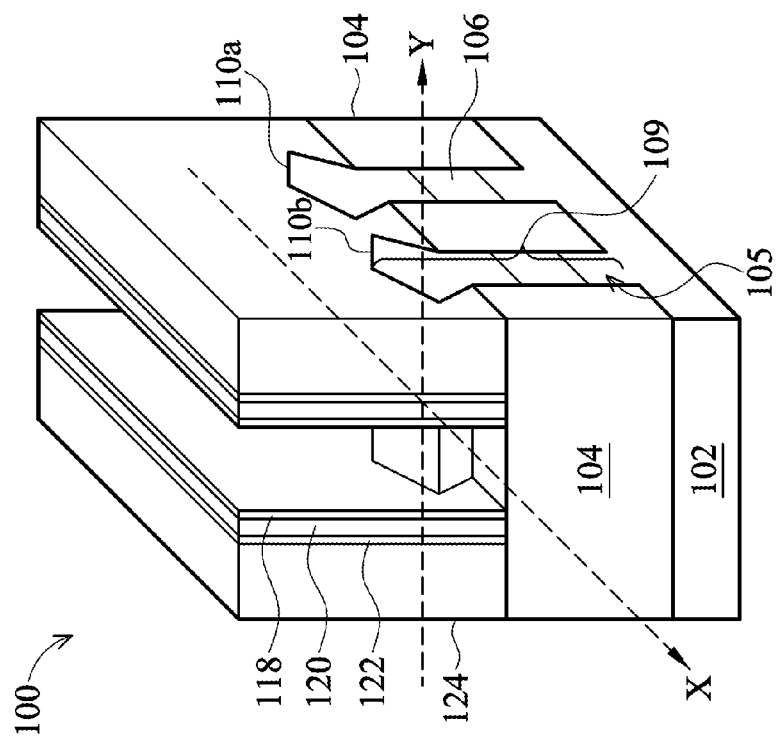
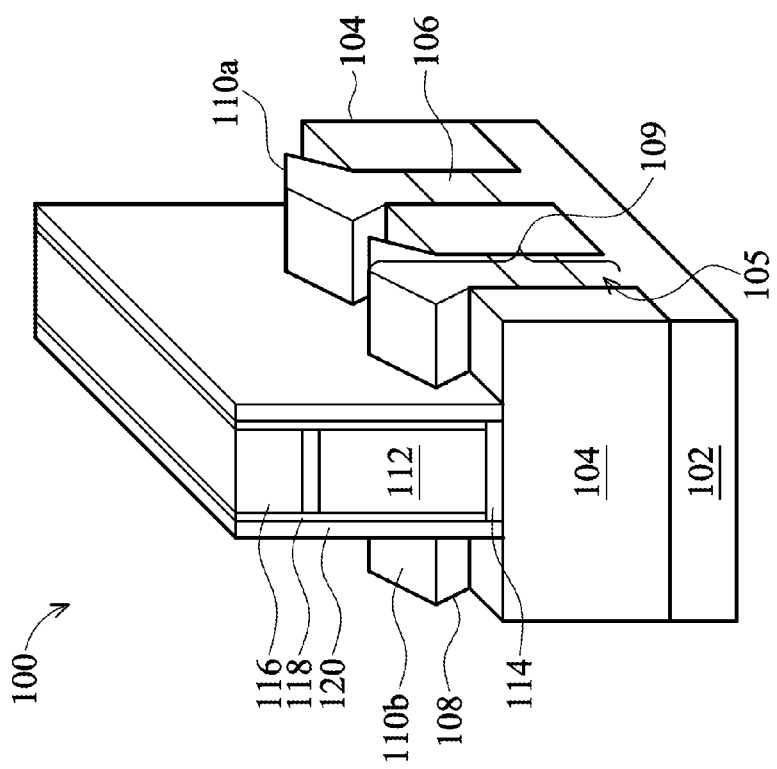

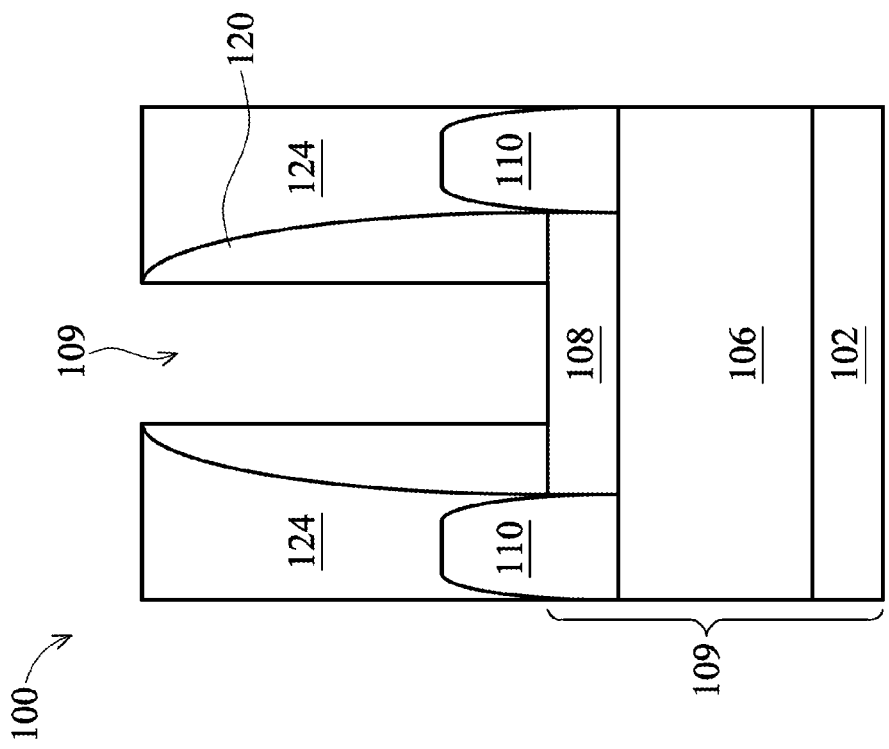
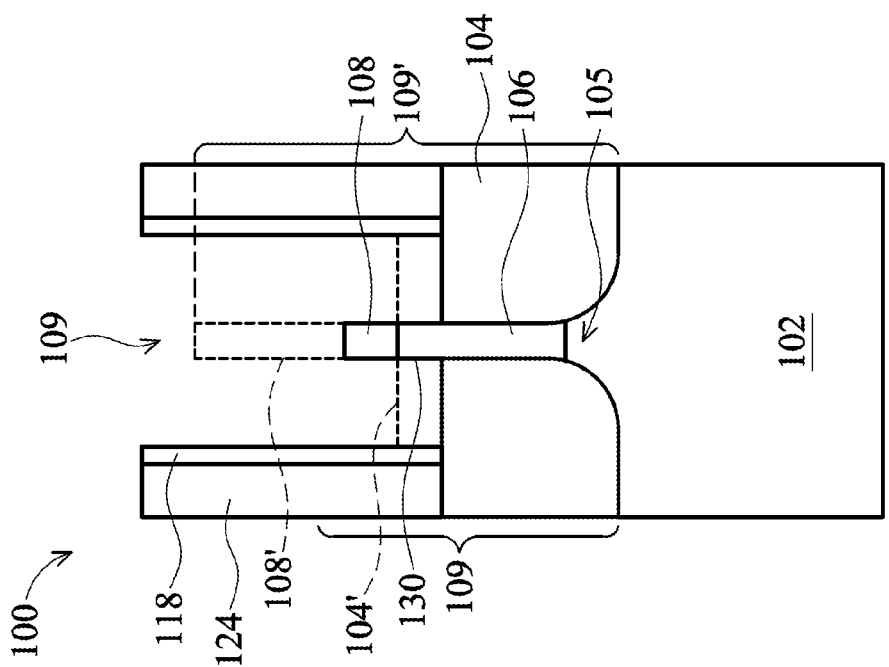

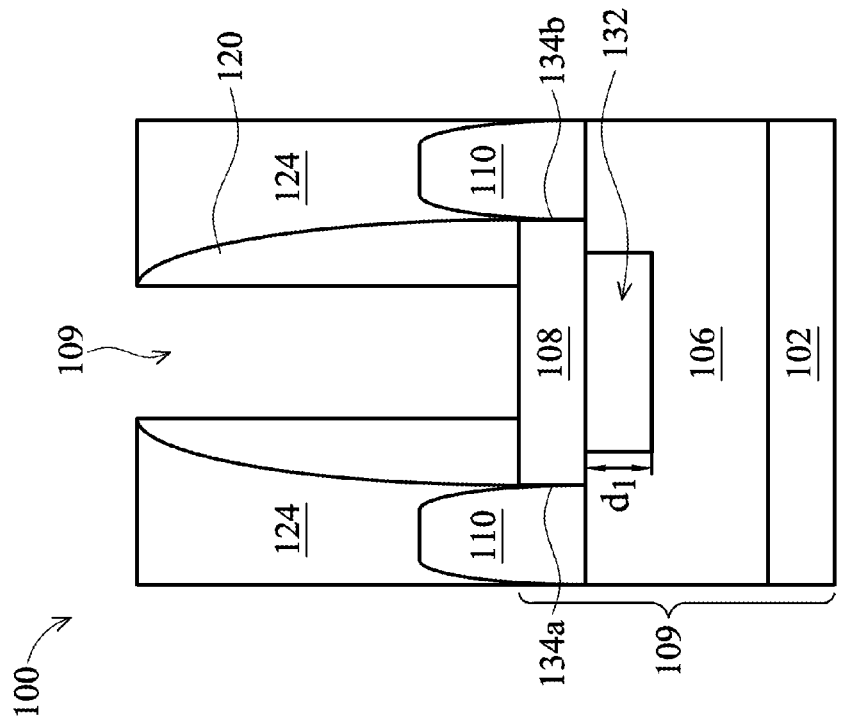
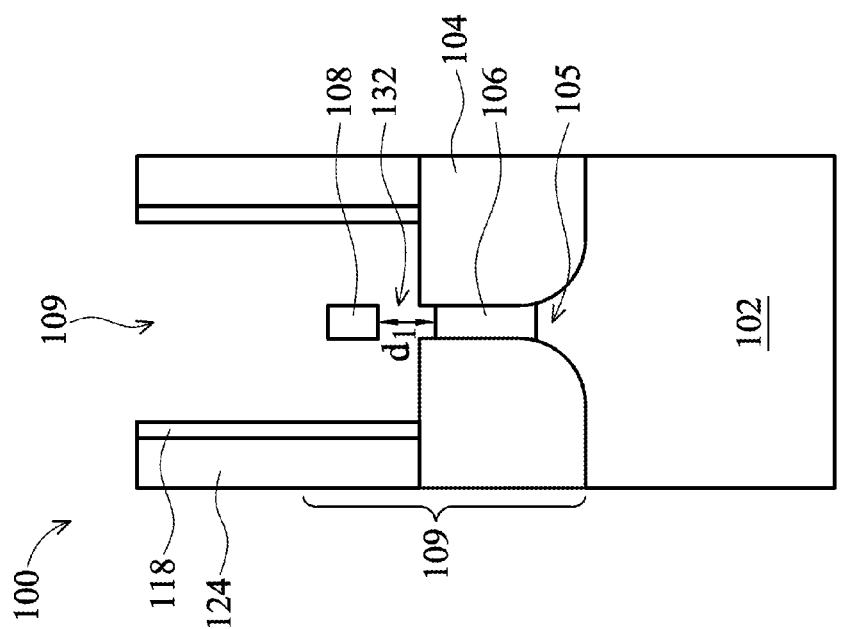
Fig. 4A
Fig. 4B

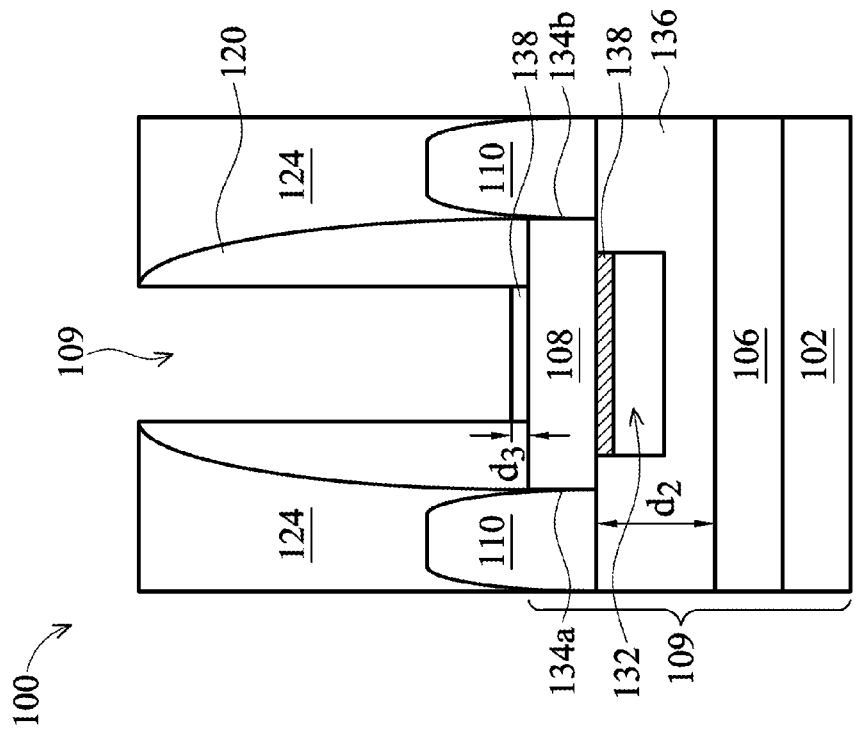
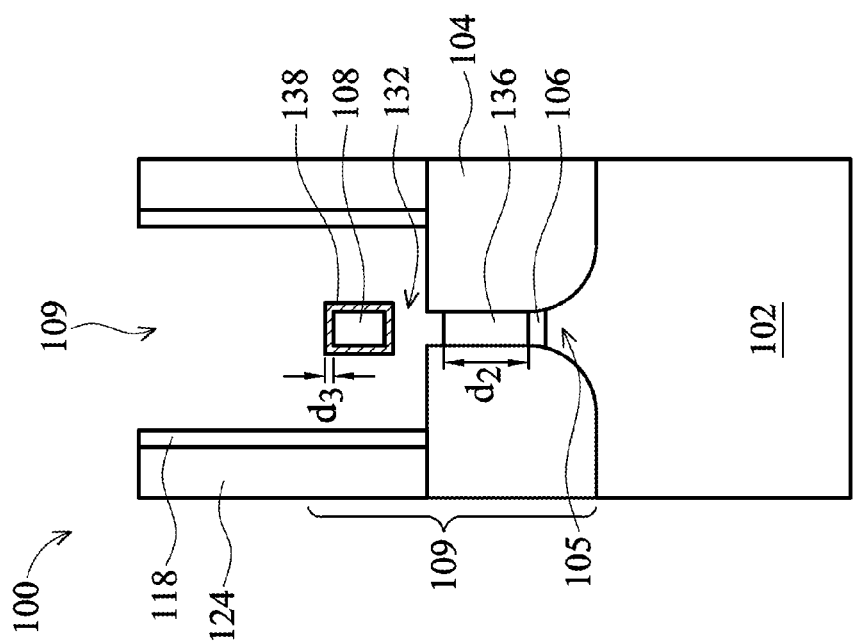
Fig. 5A
Fig. 5B

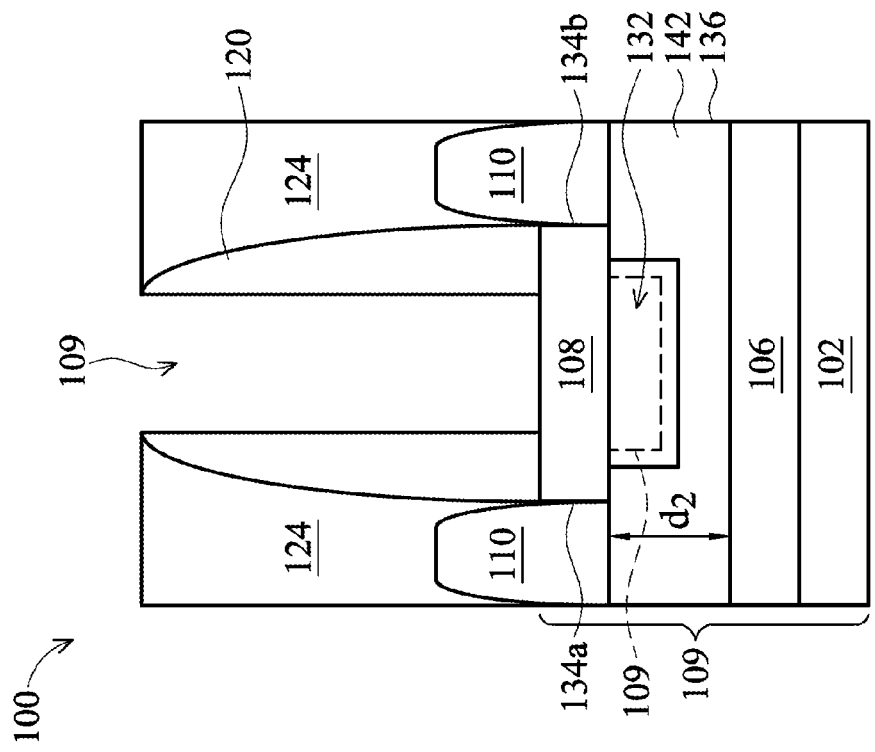
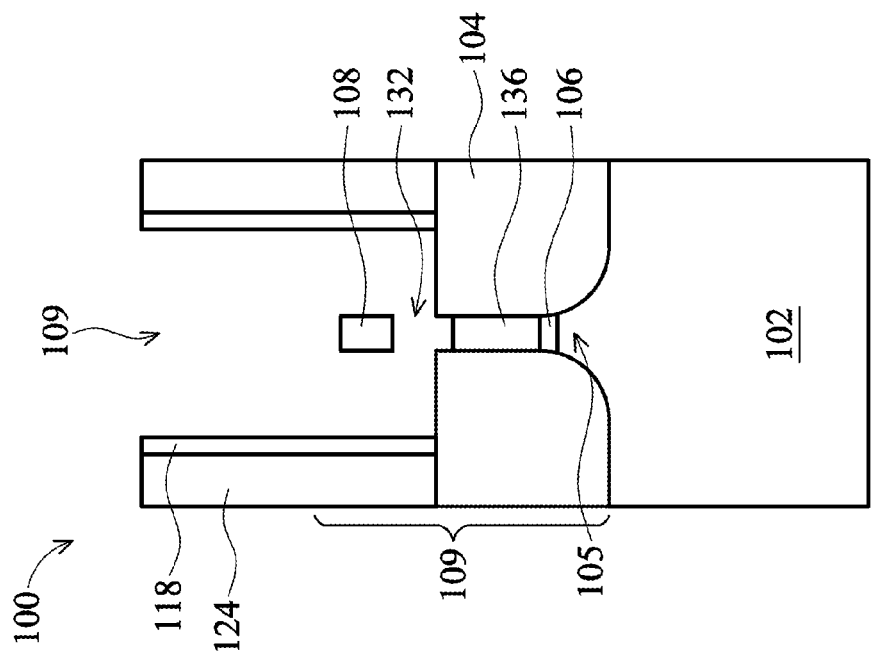
Fig. 6B
Fig. 6A

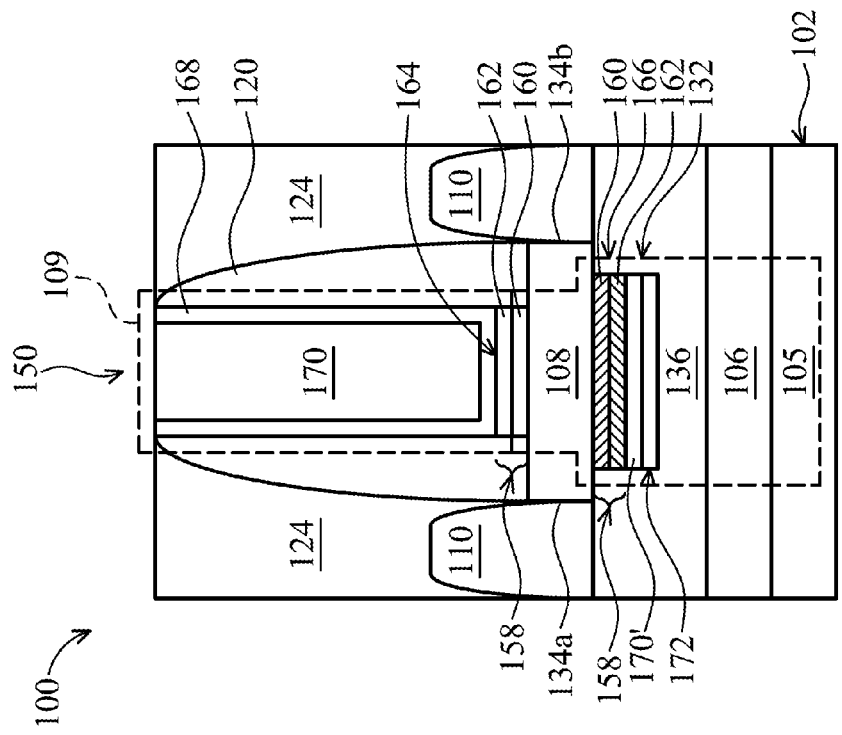
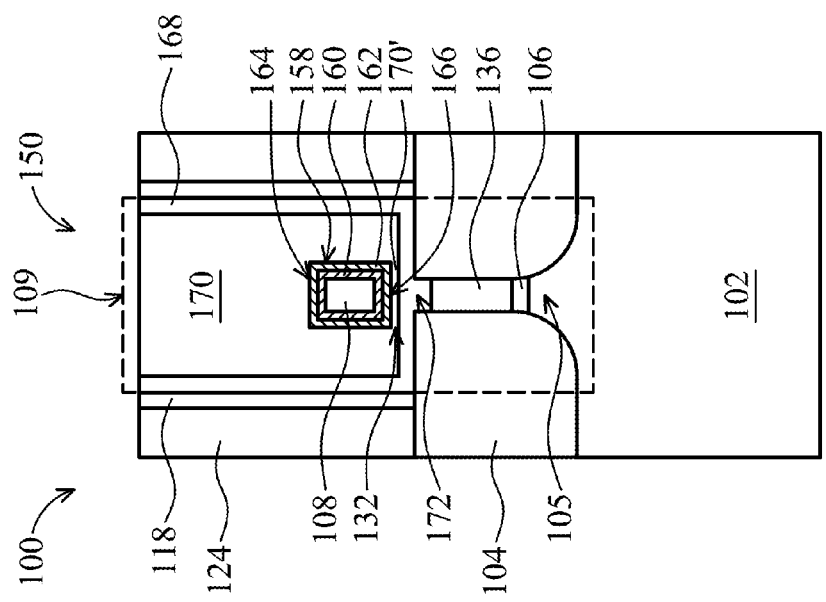
Fig. 7A
Fig. 7B

SEMICONDUCTOR DEVICES AND METHODS OF MANUFACTURE THEREOF

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Multiple gate field-effect transistors (MuGFETs) are a recent development in semiconductor technology which typically are metal oxide semiconductor FETs (MOSFETs) that incorporate more than one gate into a single device. The multiple gates may be controlled by a single gate electrode, where the multiple gate surfaces act electrically as a single gate, or by independent gate electrodes.

One type of MuGFET is referred to as a FinFET, which is a transistor structure with a fin-like semiconductor channel that is raised vertically away from the silicon surface of an integrated circuit. A recent design for FinFETs is a gate-all-around (GAA) FinFET, which has a gate material that surrounds a channel region on all sides.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 1 shows a perspective view of a FinFET at an initial manufacturing stage in accordance with some embodiments of the present disclosure;

FIG. 2 is a perspective view of the FinFET shown in FIG. 1 after a top portion of the fin has been removed in accordance with some embodiments;

FIGS. 3A and 3B are X and Y views, respectively, of the FinFET shown in FIG. 2 after recessing a second semiconductive material of the fin and an insulating material proximate the fin;

FIGS. 4A and 4B are X and Y views, respectively, of the FinFET shown in FIGS. 3A and 3B after removal of a top portion of a first semiconductive material of the fin that is disposed beneath the second semiconductive material;

FIGS. 5A and 5B are X and Y views, respectively, of the FinFET shown in FIGS. 4A and 4B after forming a first oxide on the first semiconductive material and a second oxide on the second semiconductive material of the fin;

FIGS. 6A and 6B are X and Y views, respectively, of the FinFET shown in FIGS. 5A and 5B after the second oxide formed on the second semiconductive material is removed;

FIGS. 7A and 7B are X and Y views, respectively, of the FinFET shown in FIGS. 6A and 6B after completing the manufacturing of the FinFET.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 8:
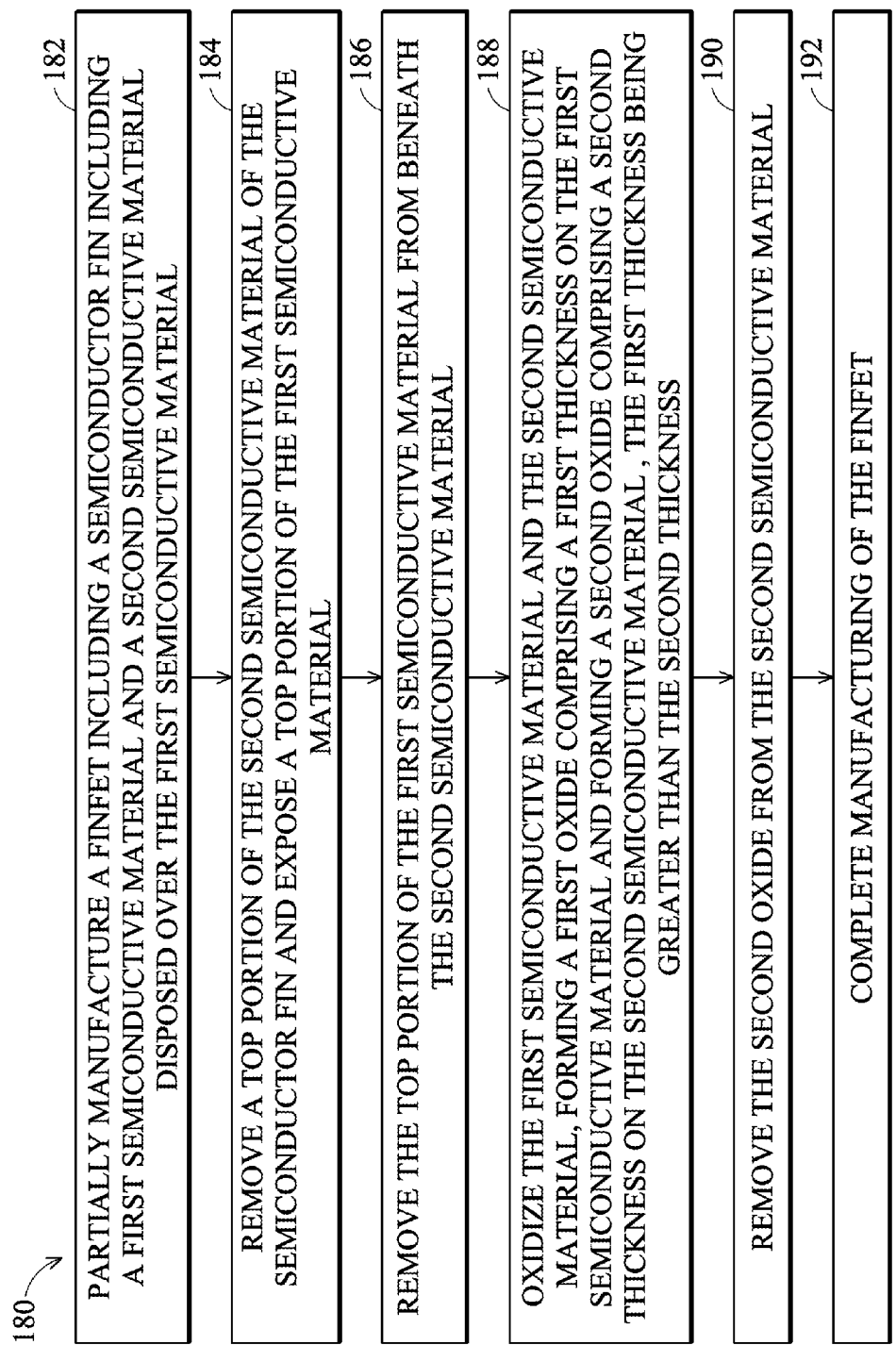
FIG. 8 is a flow chart of a method of manufacturing a semiconductor device comprising a GAA FinFET in accordance with some embodiments.

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to GAA FinFETs. Novel methods of manufacturing GAA FinFETs and structures thereof will be described herein.

Referring first to FIG. 1, there is shown a perspective view of a semiconductor device 100 comprising a FinFET in an initial manufacturing stage in accordance with some embodiments of the present disclosure. The semiconductor device 100 includes a workpiece 102. The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

The FinFET of the semiconductor device 100 has been partially manufactured in the view shown in FIG. 1. A first semiconductive material 106 is disposed over the workpiece 102, and a second semiconductive material 108 is disposed over the first semiconductive material 106. In some embodiments, the first semiconductive material 106 comprises SiGe, and the first semiconductive material 106 comprises a thickness of about 30 nm to 50 nm. In some embodiments, the second semiconductive material 108 comprises Si, Ge, or a III-V material having a thickness of about 30 nm to 50 nm. In embodiments wherein the second semiconductive material 108 comprises a III-V material, the second semiconductive material 108 may comprise InSb, InGaSb, InAs, InGaAs, GaAs, GaSb, GaAs, or combinations thereof, as examples. The second semiconductive material 108 comprises a material that oxidizes slower than the first semiconductive material 106 in some embodiments, for example. Alternatively, the first semiconductive material 106 and the second semiconductive material 108 may comprise other materials and dimensions.

The first semiconductive material 106 and the second semiconductive material 108 comprise fins 109 of semiconductive material that protrude away vertically from the workpiece 102 by a predetermined amount, such as about 10 to 20 nm. The fins 109 also include a portion 105 of the workpiece 102 in some embodiments. Portions of the fins 109 may be formed from a SOI or GOI substrate in some embodiments. In other embodiments, material layers comprising the desired material of the first semiconductive material 106 and the second semiconductive material 108 may be deposited over the workpiece 102 and then patterned to form the fins 109. The fins 109 may comprise a width of about 15 to 50 nm and may be spaced apart by about 15 to 50 nm in some embodiments, as examples. Alternatively, the fins 109 may comprise other dimensions and may be spaced apart by other amounts.

Portions of the fins 109 may comprise source and drain regions 110a and 110b of the FinFET. Top portions of the second semiconductive material 108 may be epitaxially grown to form the source and drain regions 110a and 110b in some embodiments, for example. In some embodiments, the source and drain regions 110a and 110b comprise SiCP that is epitaxially grown on the second semiconductive material 108 of the fins 109, as an example. Alternatively, the source and drain regions 110a and 110b may comprise other materials and may be formed using other methods, e.g., such as deposition methods. The fins 109 that include the source and drain regions 110a and 110b at the edges in the view shown in FIG. 1 also extend beneath the material layers 112, 116, 118, and 120 in a channel region and gate region of the FinFET that will later be formed, which will be described further herein. The channel region and gate region do not include the epitaxially grown enlarged regions of the fins 109 of the source and drain regions 110a and 110b in some embodiments, for example.

The partially manufactured FinFET shown in FIG. 1 includes an isolation region 104 disposed between and around portions of the fins 109 comprising the first semiconductive material 106, the second semiconductive material 108, and portions 105 of the workpiece 102. The isolation region 104 comprises a shallow trench isolation (STI) region in some embodiments, for example. The isolation region 104 comprises $SiO_2$, $Si_xN_y$, SiON, or multiple layers or combinations thereof, as examples. Alternatively, the isolation region 104 may comprise other materials.

The partially manufactured FinFET illustrated in FIG. 1 includes a plurality of material layers 112, 114, 116, 118, and 120 formed over the isolation regions 104, the semiconductive materials 106 and 108, and portions 105 of the workpiece 102 comprising the fins 109. Material layers 114, 112, and 116 are sacrificial material layers used to shape a subsequently formed gate and gate dielectric of the FinFET. For example, material layer 114 comprises an insulating material such as $SiO_2$, $Si_xN_y$, or SiON, and material layer 112 comprises a layer of polysilicon disposed over material layer 114. Material layer 116 comprises a hard mask material comprising one or more insulating material layers, such as $Si_xN_y$ and/or SiCN. Material layers 118 and 120 are sidewall spacer materials comprised of an insulating material, such as an oxide or nitride. Alternatively, material layers 112, 114, 116, 118, and 120 may comprise other materials.

Next, a contact etch stop layer (CESL) 122 is formed over sidewalls of the spacers 120, and an inter-level dielectric (ILD) 124 comprising an insulating material such as $SiO_2$ or other insulators is formed over the CESL 122, the isolation region 104, and the source and drain regions 110a and 110b, as shown in a perspective view in FIG. 2. Material layers 112, 114, and 116 are also removed using one or more etch processes, also shown in FIG. 2.

FIG. 2 also illustrates two views X and Y of the FinFET of the semiconductor device 100 that will be shown in FIGS. 3A, 3B, 4A, 4B, 5A, 5B, 6A, 6B, 7A, and 7B. A view along the line labeled X in FIG. 2 is shown at various stages of manufacturing in FIGS. 3A, 4A, 5A, 6A, and 7A. A view along the line labeled Y in FIG. 2 is shown in FIGS. 3B, 4B, 5B, 6B, and 7B. Note that for simplicity, not all of the material layers shown in FIGS. 1 and 2 are included in the X and Y views shown in FIGS. 3A, 3B, 4A, 4B, 5A, 5B, 6A, 6B, 7A, and 7B.

FIGS. 3A and 3B show X and Y views, respectively, of the FinFET shown in FIG. 2 after a top portion of the fins 109 of the FinFET is removed. For example, a top portion of the second semiconductive material 108 of the fins 109 is removed in accordance with some embodiments. The isolation region 104 is recessed to expose a top portion of the first semiconductive material 106 of the fins 109. In some embodiments, a single etch process is used to remove the top portion of the second semiconductive material 108 of the fins 109 and the top portion of the isolation region 104. In other embodiments, a first etch process is used to remove the top portion of the second semiconductive material 108 of the fins 109, and a second etch process is used to remove the top portion of the isolation region 104 to expose the top portion of the first semiconductive material 106 of the fins 109.

FIGS. 3A and 3B illustrate the semiconductor device 100 after recessing the second semiconductive material 108 of the fin 109 and after recessing the insulating material comprising the isolation region 104 proximate the fin 109. The second semiconductive material 108 before the recessing step is shown at 108' in phantom (e.g., in dashed lines), and the isolation region 104 before the recessing step is also shown at 104' in phantom in FIG. 3A. The second semiconductive material 108 and the isolation region 104 may be recessed using a single etching step or two etching steps, depending on the materials of the second semiconductive material 108 and the isolation region 104 and the type of etch process used, for example. In some embodiments, the second semiconductive material 108 and the isolation region 104 are recessed simultaneously.

Next, a top portion of the first semiconductive material 106 of the fin 109 is removed using an etching process. FIGS. 4A and 4B are X and Y views, respectively, of the FinFET shown in FIGS. 3A and 3B after the removal of the top portion of the first semiconductive material 106 of the fin 109 that is disposed beneath the second semiconductive material 108. An etch process selective to the material of the first semiconductive material 106 is used. An etch process is used that is adapted to etch away a portion of the first semiconductive material 106 yet leave the second semiconductive material 108 remaining in the structure. In other embodiments, a portion of the second semiconductive material 108 may be removed during the etch process used to remove the top portion of the first semiconductive material 106 of the fin 109, as another example.

Removing the top portion of the first semiconductive material 106 leaves a recess 132 beneath the second semiconductive material 108. In FIG. 4A, the second semiconductive material 108 appears to be "floating" above the recessed first semiconductive material 106. However, in FIG. 4B, it can be seen that the second semiconductive material 108 is anchored at a first end 134a and at a second end 134b opposite the first end 134a by the source and drain regions 110, portions of the first semiconductive material 106 and the spacers 120. The vertical height of the recess 132 of the first semiconductive material 106 comprise a dimension $d_1$ comprising about 1 nm to 5 nm in some embodiments, as an example. Alternatively, the vertical height of the recess 132 comprising dimension $d_1$ may comprise other dimensions.

An oxide is then formed on the first semiconductive material 106 and the second semiconductive material 108 using an oxidation process. FIGS. 5A and 5B are X and Y views, respectively, of the FinFET shown in FIGS. 4A and 4B after the formation of a first oxide 136 on the first semiconductive material 106 and a second oxide 138 on the second semiconductive material 108 of the fin 109. In some embodiments, the first oxide 136 and the second oxide 138 are formed on the first semiconductive material 106 and the second semiconductive material 108, respectively, simultaneously using a single oxidation process. Alternatively, the first and second oxides 136 and 138 can be formed in two separate oxidation processes, in other embodiments.

In embodiments wherein the first semiconductive material 106 comprises SiGe and the second semiconductive material 108 comprises Si, the first oxide 136 comprises SiGeOx, and the second oxide 138 comprises SiOx (e.g., SiO$_2$). The first oxide 136 comprises a material of the first semiconductive material 106 combined with oxygen, and the second oxide 138 comprises a material of the second semiconductive material 108 combined with oxygen, for example. The second oxide 138 comprises SiOx, GeOx, InSbOx, InGaSbOx, InAsOx, InGaAsOx, GaAsOx, GaSbOx, or GaAsOx in some embodiments, for example. Alternatively, the first oxide 136 and the second oxide 138 may comprise other materials.

The first oxide 136 comprises a first thickness comprising dimension d$_2$, and the second oxide 138 comprises a second thickness comprising dimension d$_3$. Dimension d$_2$ comprises about 1 nm to 2 nm in some embodiments, as an example. Dimension d$_3$ comprises about 10 nm to 20 nm in some embodiments, as another example. Dimension d$_2$ is greater than dimension d$_3$ in accordance with some embodiments. Dimension d$_2$ is at least 5× greater than dimension d$_3$ in accordance with some embodiments. Alternatively, the thicknesses comprising dimensions d$_2$ and d$_3$ of the first and second oxides 136 and 138, respectively, may comprise other dimensions or relative dimensions.

In accordance with some embodiments, the first semiconductive material 106 oxidizes at a faster rate than the second semiconductive material 108. For example, SiGe oxidizes faster than Si, particularly in certain environmental or oxidation conditions. In accordance with some embodiments, an oxidization process is used that achieves a greater amount of oxidation on the first semiconductive material 106 than on the second semiconductive material 108. In some embodiments, the first semiconductive material 106 oxidizes at a first oxidation rate, and the second semiconductive material 108 oxidizes at a second oxidation rate, wherein the first oxidation rate is more than about 5 times greater than the second oxidation rate, for example. The first oxidation rate is more than about 6 times greater than the second oxidation rate in some embodiments. In other embodiments, the first oxidation rate is more than about 10 to 20 times greater than the second oxidation rate, as another example.

The first and second semiconductive materials 106 and 108 are oxidized using an in-situ steam generation (ISSG) process, a wet furnace process, and/or a H$_2$/O$_2$ plasma process in some embodiments. For example, an ISSG process can be used to oxidize the first and second semiconductive materials 106 and 108 in some embodiments. The ISSG process comprises introducing oxygen at a temperature of about 300 degrees C. to 800 degrees C., a pressure of about 5 Torr to 40 Torr, a total gas flow of about 5 standard liters per minute (s.l.m.) to 50 s.l.m., a H$_2$% of about 2 to 33%, and a process time of about 30 seconds to 10 minutes in some embodiments. As another example, a wet furnace process can be used to oxidize the first and second semiconductive materials 106 and 108 in some embodiments. The wet furnace process comprises a temperature of about 300 degrees C. to 800 degrees C., a pressure of about 200 Torr to 760 Torr, a total H$_2$O flow of about 5 liters (L) to 20 L, and a process time of about 10 minutes to 200 minutes in some embodiments. As yet another example, a H$_2$/O$_2$ plasma process can be used to oxidize the first and second semiconductive materials 106 and 108 in some embodiments. The H$_2$/O$_2$ plasma process comprises a high temperature process at a temperature of about 300 degrees C. to 800 degrees C., a pressure of about 0.1 Torr to 20 Torr, a radio frequency (RF) power of about 10 Watts (W) to 4,000 W, a total gas flow (H$_2$+O$_2$) of about 100 standard cubic centimeters per minute (s.c.c.m.) to 4,000 s.c.c.m., and a process time of about 20 seconds to 20 minutes. Alternatively, the ISSG process, wet furnace process, and H$_2$/O$_2$ plasma process may comprise other processing parameters, and other methods can be used to form the first oxide 136 and the second oxide 138 on exposed portions of the first semiconductive material 106 and the second semiconductive material 108, respectively.

Next, the second oxide 138 is removed from the second semiconductive material 108. FIGS. 6A and 6B are X and Y views, respectively, of the FinFET shown in FIGS. 5A and 5B after the second oxide 138 formed on the second semiconductive material 108 is removed. The second oxide 138 is removed using an etch process.

In some embodiments, a portion 140 (illustrated in phantom in FIG. 6B) of the first oxide 136 is also removed using the etch process for the second oxide 138, for example. The portion 140 of the first oxide 136 is simultaneously removed with the removal of the second oxide 138 in some embodiments. In other embodiments, a portion 140 of the first oxide 136 is not removed, as another example. In some embodiments, an etch process is used to remove the second oxide 138 that is also adapted to remove the material of the first oxide 136. Advantageously, because the second oxide 138 forms less quickly in the oxidation process than the first oxide 136, the second oxide 138 comprises a thickness comprising dimension d$_3$ that is less than a thickness comprising dimension d$_2$ of the first oxide 136, a portion 142 of the first oxide 136 is left remaining on the first semiconductive material 106, in some embodiments, also illustrated in FIG. 6B.

Next, the manufacturing process of the FinFET 150 is continued to complete the fabrication of the semiconductor device 100. FIGS. 7A and 7B are X and Y views, respectively, of the FinFET shown in FIGS. 6A and 6B after completing the manufacturing of the FinFET 150. A gate dielectric 158/168 is formed over and around the second semiconductive material 108, and a gate 170 comprising a conductive material is formed over and around the gate dielectric 158/168. The gate dielectric 158/168 comprises one or more insulating material layers. As an example, the gate dielectric 158/168 may comprise a first insulating material 158 that includes a first layer 160 of silicon dioxide having a thickness of about 5 to 20 Angstroms. The first insulating material 158 includes a second layer 162 of a high dielectric constant (k) insulating material having a dielectric constant greater than a dielectric constant of SiO$_2$, such as HfO$_2$ or ZrO$_2$. The first insulating material 158 has a thickness of about 10 to 30 Angstroms in some embodiments. The gate dielectric 158/168 may comprise a second insulating material 168 that is deposited before the gate 170 material is deposited. The second insulating material 168 comprises a high k insulating material such as HfO$_2$ or ZrO$_2$ having a thickness of about 10 to 30 Angstroms in some embodiments. The second insulating material 168 is not included in some embodiments, for example. Alternatively, the gate dielectric 158/168 may comprise a single material layer and/or may comprise other materials and dimensions, for example.

The gate 170 material comprises a conductive material, such as TiN, TaN, TiAl, TiN, AlTi, AlTiO, and/or W comprising a thickness of about 100 to 300 Angstroms in some embodiments. Alternatively, the gate 170 may comprise other materials and dimensions. A portion of the gate 170 after depositing the gate material extends around all sides of the second semiconductive material 108, as can be seen in the view shown in FIG. 7A, and thus, the FinFET 150 comprises a gate-all-around GAA device.

The second semiconductive material 108 comprises a channel region of the GAA FinFET 150. The semiconductive material 108 comprises a nanowire in some embodiments, for example. The FinFET 150 includes a source region 110 proximate a first end 134a of the nanowire and a drain region 110 proximate a second end 134*b* of the nanowire, the second end 134*b* being opposite the first end 134*a*. In some embodiments, the source region 110 and the drain region 110 comprise SiCP. Alternatively, the source region 110 and the drain region 110 may comprise other materials. The oxidized portion of the first semiconductive material 106, e.g., the first oxide 136 comprises an insulating material disposed between the source region 110 and the drain region 110. The first oxide 136 functions as an insulator between the source and region regions 110, for example.

The semiconductor device 100 comprising the GAA FinFET 150 includes a fin 109 disposed over the workpiece 102, which is also illustrated in FIGS. 7A and 7B. The fin 109 includes a portion of the workpiece 105 in some embodiments, the first semiconductive material 106 disposed over the workpiece 105, and an oxide of the first semiconductive material (e.g., the first oxide 136) disposed over the first semiconductive material 106. The fin 109 includes the second semiconductive material 108 disposed over the first oxide 136. The fin 109 also includes a conductive material (e.g., the gate 170) disposed over and around the second semiconductive material 108, a portion 170' of the conductive material 170 being disposed between the first oxide 136 and the second semiconductive material 108. The fin 109 of the FinFET 150 includes the first insulating material 158 disposed around the second semiconductive material 108, a first portion 164 of the first insulating material 158 being disposed between a top surface of the second semiconductive material 108 and the conductive material of the gate 170, and a second portion 166 of the first insulating material 158 being disposed between a bottom surface of the second semiconductive material 108 and the portion 170' of the conductive material of the gate 170. The second insulating material 168 is disposed around regions of the conductive material of the gate 170, and a portion 172 of the second insulating material 168 is disposed between the portion 170' of the conductive material of the gate 170 and the first oxide 136. The fin 109 protrudes away vertically from the workpiece 102 by a predetermined amount, such as about 10 to 20 nm, for example. The first insulating material 158, the portion 170' of the gate 170 material, and the second insulating material 168 fill the gap 132 between the first oxide 136 of the first semiconductive material 106 and the second semiconductive material 108.

After the manufacturing process stage shown in FIGS. 7A and 7B, additional insulating material layers (not shown) may be formed over the FinFET 150, and contacts (also not shown) may be formed within the insulating material layers that make electrical connection to portions of the FinFET 150, such as to the gate 170 and source and drain regions 110, as examples. Conductive lines and vias may be formed over the FinFET 150 in a back-end-of-line (BEOL) process, for example, also not shown.

FIG. 8 is a flow chart 180 of a method of manufacturing a semiconductor device 100 comprising a GAA FinFET 150 in accordance with some embodiments. In step 182, a FinFET is partially manufactured that includes a semiconductor fin 109 including a first semiconductive material 106 and a second semiconductive material 108 disposed over the first semiconductive material 106 (see FIG. 1). In step 184, a top portion of the second semiconductive material 108 of the semiconductor fin 109 is removed, and a top portion of the first semiconductive material 106 is exposed (see FIGS. 2, 3A, and 3B). In step 186, the top portion of the first semiconductive material 106 is removed from beneath the second semiconductive material 108 (see FIGS. 4A and 4B). In step 188, the first semiconductive material 106 and the second semiconductive material 108 are oxidized, forming a first oxide 136 comprising a first thickness comprising dimension $d_2$ and forming a second oxide 138 comprising a second thickness comprising dimension $d_3$ on the second semiconductive material 108, the first thickness (comprising dimension $d_2$) being greater than the second thickness (comprising dimension $d_3$) (see FIGS. 5A and 5B). In step 190, the second oxide 138 is removed from the second semiconductive material 108 (see FIGS. 6A and 6B). In step 192, the manufacturing process of the FinFET 150 is then completed, also shown in FIGS. 7A and 7B.

Some embodiments of the present disclosure include methods of forming semiconductor devices 100 comprising GAA FinFETs 150, and also include semiconductor devices 100 that include the novel GAA FinFET 150 structures described herein.

Advantages of some embodiments of the disclosure include providing novel methods of forming GAA FinFETs 150 that utilize materials having different oxidation rates to form the desired structures. Novel thermal oxidation processes are used to form the Si/Ge/III-V GAA FinFET devices 150. The GAA FinFET devices 150 comprise three dimensional (3D) gate-all-around nanowire device structures wherein the channels comprise Si, Ge, and/or III-V materials (e.g., the second semiconductive material 108).

The first semiconductive material 106 and second semiconductive material 108 are simultaneously oxidized in some embodiments, and due to the different oxidation rates of the first and second semiconductive materials 106 and 108, a thicker oxidation layer comprising the first oxide 136 is formed between the source and drain regions 110, and a thinner oxidation layer comprising the second oxide 138 is formed around the second semiconductive material 108 comprising the channel. In some embodiments, a greater than 5:1 oxidation rate ratio (e.g., a ratio of the first semiconductive material 106 oxidation rate to the second semiconductive material 108 oxidation rate) is achieved by the thermal oxidation process or processes, which results in an improved quality of the first oxide 136. The thicker first oxide 136 of the first semiconductive material 106 remains in the structure as an isolation layer between the source and drain regions 110, preventing electrical leaks through the first semiconductive material 106, for example.

The first oxide 136 and the second oxide 138 are self-aligned using the thermal oxidation tools and methods described herein. Because the first oxide 136 has a greater thickness than the second oxide 138, the second oxide 138 can be removed using a single etch process, leaving the self-aligned first oxide 136 remaining in the structure. A gap 132 is formed between the first semiconductive material 106 and the second semiconductive material 108 so that a gate material can be formed completely around the second semiconductive material 108 which comprises the channel, forming the GAA FinFET 150. The second semiconductive material 108 comprising the channel comprises a nanowire, resulting in an improvement in the density of trapped states (Dit) between the oxide-to-semiconductor interface (e.g., the first insulating material 158 to the second semiconductive material 108), and which further results in an improvement in device performance, i.e., improving the transconductance (Gm), carrier mobility, drain current, and/or sub-threshold swing of the GAA FinFET 150, as examples. Furthermore, the novel GAA FinFET 150 structures, designs, and manufacturing methods are easily implementable in manufacturing process flows.

In accordance with some embodiments of the present disclosure, a method of manufacturing a semiconductor device includes partially manufacturing a FinFET including a semiconductor fin comprising a first semiconductive material and a second semiconductive material disposed over the first semiconductive material. A top portion of the second semiconductive material of the semiconductor fin is removed, and a top portion of the first semiconductive material is exposed. A top portion first semiconductive material is removed from beneath the second semiconductive material. The first semiconductive material and the second semiconductive material are oxidized, forming a first oxide comprising a first thickness on the first semiconductive material and a second oxide comprising a second thickness on the second semiconductive material, the first thickness being greater than the second thickness. The second oxide is removed from the second semiconductive material, and manufacturing of the FinFET is completed.

In accordance with other embodiments, a method of manufacturing a semiconductor device includes partially manufacturing a fin field effect transistor (FinFET) including a semiconductor fin comprising a first semiconductive material disposed over a workpiece, the first semiconductive material being adjacent an isolation region, the semiconductor fin further comprising a second semiconductive material disposed over the first semiconductive material. The method includes removing a top portion of the second semiconductive material of the semiconductor fin, recessing the isolation region to expose sidewalls of a top portion of the first semiconductive material, and removing the top portion of the first semiconductive material from beneath the second semiconductive material. The method includes oxidizing the first semiconductive material and the second semiconductive material, wherein oxidizing the first semiconductive material and the second semiconductive material forms a first oxide comprising a first thickness on the first semiconductive material and forms a second a second oxide comprising a second thickness on the second semiconductive material, the first thickness being greater than the second thickness. The second oxide is removed from the second semiconductive material, and a portion of the first oxide is removed from the first semiconductive material. A gate dielectric is formed over and around the second semiconductive material, and a gate is formed over and around the gate dielectric.

In accordance with other embodiments, a semiconductor device includes a fin disposed over a workpiece. The fin includes a first semiconductive material disposed over a workpiece, an oxide of the first semiconductive material disposed over the first semiconductive material, and a second semiconductive material disposed over the oxide of the first semiconductive material. The fin includes a conductive material disposed over and around the second semiconductive material. A portion of the conductive material is disposed between the oxide of the first semiconductive material and the second semiconductive material. The fin includes a first insulating material disposed around the second semiconductive material. A first portion of the first insulating material is disposed between a top surface of the second semiconductive material and the conductive material, and a second portion of the first insulating material is disposed between a bottom surface of the second semiconductive material and the conductive material. The fin includes a second insulating material disposed around regions of the conductive material. A portion of the second insulating material is disposed between the conductive material and the oxide of the first semiconductive material. The conductive material of the fin comprises a gate of a gate-all-around (GAA) fin field effect transistor (FinFET), and the second semiconductive material comprises a channel region of the GAA FinFET.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
    partially manufacturing a fin field effect transistor (FinFET) including a semiconductor fin comprising a first semiconductive material and a second semiconductive material disposed over the first semiconductive material;
    removing a top portion of the second semiconductive material of the semiconductor fin;
    exposing a top portion of the first semiconductive material;
    removing the top portion of the first semiconductive material from beneath the second semiconductive material;
    oxidizing the first semiconductive material and the second semiconductive material, wherein oxidizing the first semiconductive material and the second semiconductive material comprises forming a first oxide comprising a first thickness on the first semiconductive material and forming a second oxide comprising a second thickness on the second semiconductive material, the first thickness being greater than the second thickness;
    removing the second oxide from the second semiconductive material; and
    completing manufacturing of the FinFET.

2. The method according to claim 1, wherein removing the second oxide also removes a first portion of the first oxide from the first semiconductive material yet leaves a second portion of the first oxide remaining on the first semiconductive material.

3. The method according to claim 1, wherein oxidizing the first semiconductive material and the second semiconductive material comprises an in-situ steam generation (ISSG) process.

4. The method according to claim 3, wherein the ISSG process comprises introducing oxygen at a temperature of about 300 degrees C. to 800 degrees C., a pressure of about 5 Torr to 40 Torr, a total gas flow of about 5 standard liters per minute (s.l.m.) to 50 s.l.m., a $H_2$% of about 2 to 33%, and a process time of about 30 seconds to 10 minutes.

5. The method according to claim 1, wherein oxidizing the first semiconductive material and the second semiconductive material comprises a wet furnace process.

6. The method according to claim 5, wherein the wet furnace process comprises a temperature of about 300 degrees C. to 800 degrees C., a pressure of about 200 Torr to 760 Torr, a total $H_2O$ flow of about 5 liters (L) to 20 L, and a process time of about 10 minutes to 200 minutes.

7. The method according to claim 1, wherein oxidizing the first semiconductive material and the second semiconductive material comprises a $H_2/O_2$ plasma process.

8. The method according to claim 7, wherein the $H_2/O_2$ plasma process comprises a high temperature process at a temperature of about 300 degrees C. to 800 degrees C., a pressure of about 0.1 Torr to 20 Torr, a radio frequency (RF) power of about 10 Watts (W) to 4,000 W, a total gas flow ($H_2+O_2$) of about 100 standard cubic centimeters per minute (s.c.c.m.) to 4,000 s.c.c.m., and a process time of about 20 seconds to 20 minutes.

9. A method of manufacturing a semiconductor device, the method comprising:
partially manufacturing a fin field effect transistor (FinFET) including a semiconductor fin comprising a first semiconductive material disposed over a workpiece, the first semiconductive material being adjacent an isolation region, the semiconductor fin further comprising a second semiconductive material disposed over the first semiconductive material;
removing a top portion of the second semiconductive material of the semiconductor fin;
recessing the isolation region to expose sidewalls of a top portion of the first semiconductive material;
removing the top portion of the first semiconductive material from beneath the second semiconductive material;
oxidizing the first semiconductive material and the second semiconductive material, wherein oxidizing the first semiconductive material and the second semiconductive material forms a first oxide comprising a first thickness on the first semiconductive material and forms a second a second oxide comprising a second thickness on the second semiconductive material, the first thickness being greater than the second thickness;
removing the second oxide from the second semiconductive material and removing a portion of the first oxide from the first semiconductive material;
forming a gate dielectric over and around the second semiconductive material; and
forming a gate over and around the gate dielectric.

10. The method according to claim 9, wherein the first semiconductive material oxidizes at a first oxidation rate, wherein the second semiconductive material oxidizes at a second oxidation rate, and wherein the first oxidation rate is more than about 5 times greater than the second oxidation rate.

11. The method according to claim 9, wherein oxidizing the first semiconductive material and the second semiconductive material comprises simultaneously oxidizing the first semiconductive material and the second semiconductive material using an oxidation process.

12. The method according to claim 9, wherein removing the second oxide from the second semiconductive material and removing the portion of the first oxide from the first semiconductive material comprise simultaneously removing the second oxide from the second semiconductive material and removing the portion of the first oxide from the first semiconductive material using an etch process.

13. A method of manufacturing a semiconductor device, the method comprising:
providing a semiconductor fin, wherein the semiconductor fin comprises:
a first semiconductive material; and
a second semiconductive material over the first semiconductive material, wherein
the second semiconductive material comprises a first portion on an opposite side of the first semiconductive material;
removing the first portion of the second semiconductive material;
recessing the first semiconductive material;
forming a first oxide with a first thickness on the first semiconductive material;
forming a second oxide with a second thickness around the second semiconductive material, the first thickness being greater than the second thickness;
removing the second oxide from the second semiconductive material; and
forming a gate dielectric around the second semiconductive material.

14. The method according to claim 13, wherein the forming the first oxide and the forming the second oxide comprise simultaneously oxidizing the first semiconductive material and the second semiconductive material.

15. The method according to claim 13, wherein the first semiconductive material oxidizes at a first oxidation rate, wherein the second semiconductive material oxidizes at a second oxidation rate, and wherein the first oxidation rate is more than about 5 times greater than the second oxidation rate.

16. The method according to claim 13, wherein at least one of the forming the first oxide and the forming the second oxide comprises an in-situ steam generation (ISSG) process.

17. The method according to claim 16, wherein the ISSG process comprises introducing oxygen at a temperature of about 300 degrees C. to 800 degrees C., a pressure of about 5 Torr to 40 Torr, a total gas flow of about 5 standard liters per minute (s.l.m.) to 50 s.l.m., a $H_2$% of about 2 to 33%, and a process time of about 30 seconds to 10 minutes.

18. The method according to claim 13, wherein at least one of the forming the first oxide and the forming the second oxide comprises a wet furnace process.

19. The method according to claim 18, wherein the wet furnace process comprises a temperature of about 300 degrees C. to 800 degrees C., a pressure of about 200 Torr to 760 Torr, a total $H_2O$ flow of about 5 liters (L) to 20 L, and a process time of about 10 minutes to 200 minutes.

20. The method according to claim 13, wherein at least one of the forming the first oxide and the forming the second oxide comprises a $H_2/O_2$ plasma process.

* * * * *

UNITED STATES PATENT AND TRADEMARK OFFICE
CERTIFICATE OF CORRECTION

PATENT NO. : 8,889,497 B2  Page 1 of 1
APPLICATION NO. : 13/730640
DATED : November 18, 2014
INVENTOR(S) : Chi-Yuan Chen et al.

It is certified that error appears in the above-identified patent and that said Letters Patent is hereby corrected as shown below:

In the Claims

In Col. 11, line 31, claim 9, delete "a second".

Signed and Sealed this
Tenth Day of March, 2015

Michelle K. Lee
*Deputy Director of the United States Patent and Trademark Office*